(12) United States Patent
Zumkehr et al.

(10) Patent No.: US 6,965,529 B2
(45) Date of Patent: Nov. 15, 2005

(54) MEMORY BUS TERMINATION

(75) Inventors: John F. Zumkehr, Orange, CA (US); James E. Chandler, Mission Viejo, CA (US)

(73) Assignee: Intel Coproration, Santa Clara, CA (US)

(*) Notice: Subject to any disclaimer, the term of this patent is extended or adjusted under 35 U.S.C. 154(b) by 146 days.

(21) Appl. No.: 10/177,047

(22) Filed: Jun. 21, 2002

(65) Prior Publication Data

US 2003/0235084 A1  Dec. 25, 2003

(51) Int. Cl.⁷ ............................................. G11C 16/04
(52) U.S. Cl. ........................ 365/189.05; 365/189.11; 365/230.08
(58) Field of Search ................. 365/189.05, 189.11, 365/230.08

(56) References Cited

U.S. PATENT DOCUMENTS

| | | | |
|---|---|---|---|
| 5,713,006 A * | 1/1998 | Shigeeda | 711/170 |
| 5,737,765 A * | 4/1998 | Shigeeda | 711/170 |
| 5,784,291 A * | 7/1998 | Chen et al. | 716/10 |
| 5,919,252 A | 7/1999 | Klein | |
| 6,051,989 A | 4/2000 | Walck | |
| 6,154,047 A | 11/2000 | Taguchi | |
| 6,157,973 A * | 12/2000 | Ohtani et al. | 710/100 |
| 6,256,235 B1 * | 7/2001 | Lee | 365/189.11 |
| 6,316,980 B1 | 11/2001 | Vogt et al. | |
| 6,347,850 B1 | 2/2002 | Volk | |
| 6,559,690 B2 * | 5/2003 | Waldrop | 327/108 |

OTHER PUBLICATIONS

Bill Gervasi, "Configurations and Considerations for DDR Memory", JEDEC Memory Parametrics, 38 pages.
Jedec Standard, "Definition of the SSTV16857 2.5 V 14-Bit SSTL_2 Registered Buffer for DDR DIMM Applications" JECED Solid State Technology Association, JESD82-3, Aug. 2001, 13 pages.
Jedec Standard, "Definition of the SSTV16857 2.5 V 13-Bit to 26-Bit SSTL_2 Registered Buffer for Stacked DDR DIMM Applications" JECED Solid State Technology Association, JESD82-4, Aug. 2001, 13 pages.
Jedec Standard, "Double Data Rate (DDR) SDRAM Specification" JECED Solid State Technology Association, JESD79, Jun. 2000, 76 pages.
Joe Marci, "DDR II—The Evolution Continues JEDEC Future Dram Task Group", ATI Technologies, 15 pages.

* cited by examiner

Primary Examiner—Richard Elms
Assistant Examiner—Tuan T. Nguyen
(74) Attorney, Agent, or Firm—Jeffrey B. Huter

(57) ABSTRACT

Methods, apparatus and machine-readable medium to terminate a memory bus line. In some embodiments, the memory bus line is terminated with one or more transistors of an output buffer that are used to drive the memory bus line during a memory write.

25 Claims, 4 Drawing Sheets

MEMORY BUS TERMINATION

BACKGROUND

Data transfer rates between system memory and memory controllers are ever increasing. To improve signal integrity at these higher transfer rates, memory devices and memory controllers include terminating resisters that match the impedance of the memory bus lines in order to reduce signal reflections on the memory bus lines. Traditional memory controllers include separate terminating resistors that are coupled to the memory bus lines during read and/or idle states of the memory bus line. Further, these memory controllers include additional logic to maintain a constant resistance over process, voltage, and temperature. These memory controllers further include circuitry to disconnect the terminating resistors from the memory bus lines during memory writes. The additional terminating resistors, logic and circuitry associated with terminating memory bus lines consumes additional die area.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

The following description describes techniques for terminating memory bus lines. In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

Figure 1:
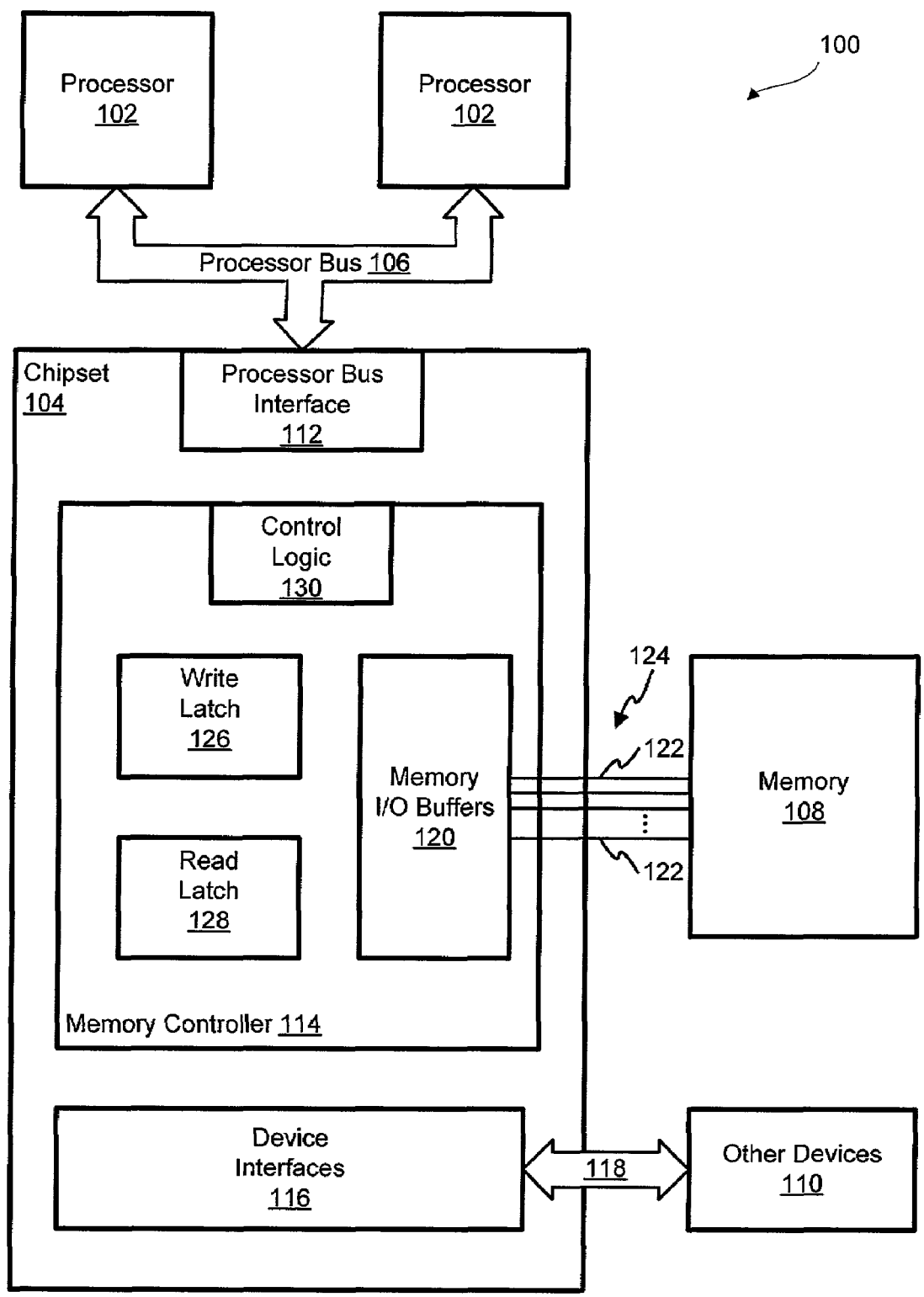
FIG. 1 illustrates an embodiment of a computing device.

An example embodiment of a computing device 100 is shown in FIG. 1. The computing device 100 may comprise one or more processors 102 coupled to a chipset 104 via a processor bus 106. The chipset 104 may comprise one or more integrated circuit packages or chips to couple the processors 102 to system memory 108 and other devices 110 (e.g. a mouse, keyboard, video controller, hard disk, floppy disk, firmware, etc.). The chipset 104 may comprise a processor bus interface 112 to access the processor bus 106, a memory controller 114 to access the system memory 108, and one or more device interfaces 116 to access devices 110. In other embodiments, the processors 102 may comprise all or a portion of the memory controller 114. The processor bus interface 112 may decode processor bus transactions issued by the processors 102 and may generate processor bus transactions on behalf of the memory controller 114 and/or the device interfaces 116. The device interfaces 116 provide interfaces to communicate with the devices 110 that are coupled to the chipset 104 via device buses 118 such as peripheral component interconnect (PCI) buses, accelerated graphics port (AGP) buses, universal serial bus (USB) buses, low pin count (LPC) buses, and/or other I/O buses.

The memory controller 114 may comprise one or more memory input/output (I/O) buffers 120 to send and receive data to and from the system memory 108 via memory bus lines 122 of a memory bus 124. The system memory 108 may be implemented with various volatile and non-volatile memory technologies such as, for example, flash memory, static memory (SRAM), dynamic memory (DRAM), double data rate memory (DDR), and RAMBUS memory. The memory controller 114 may further comprise write latches 126 to store data to be transferred to system memory 108 via the memory I/O buffers 120 and read latches 128 to store data received from the system memory 108 via the memory I/O buffers 120. The memory controller 114 may further comprise control logic 130 to control data transfers between the latches 126, 128 and the processor bus interface 112. The control logic 130 may further calibrate the memory I/O buffers 120 and may control transfers between the latches 126, 128 and the system memory 108 via the memory I/O buffers 120.

Figure 2:
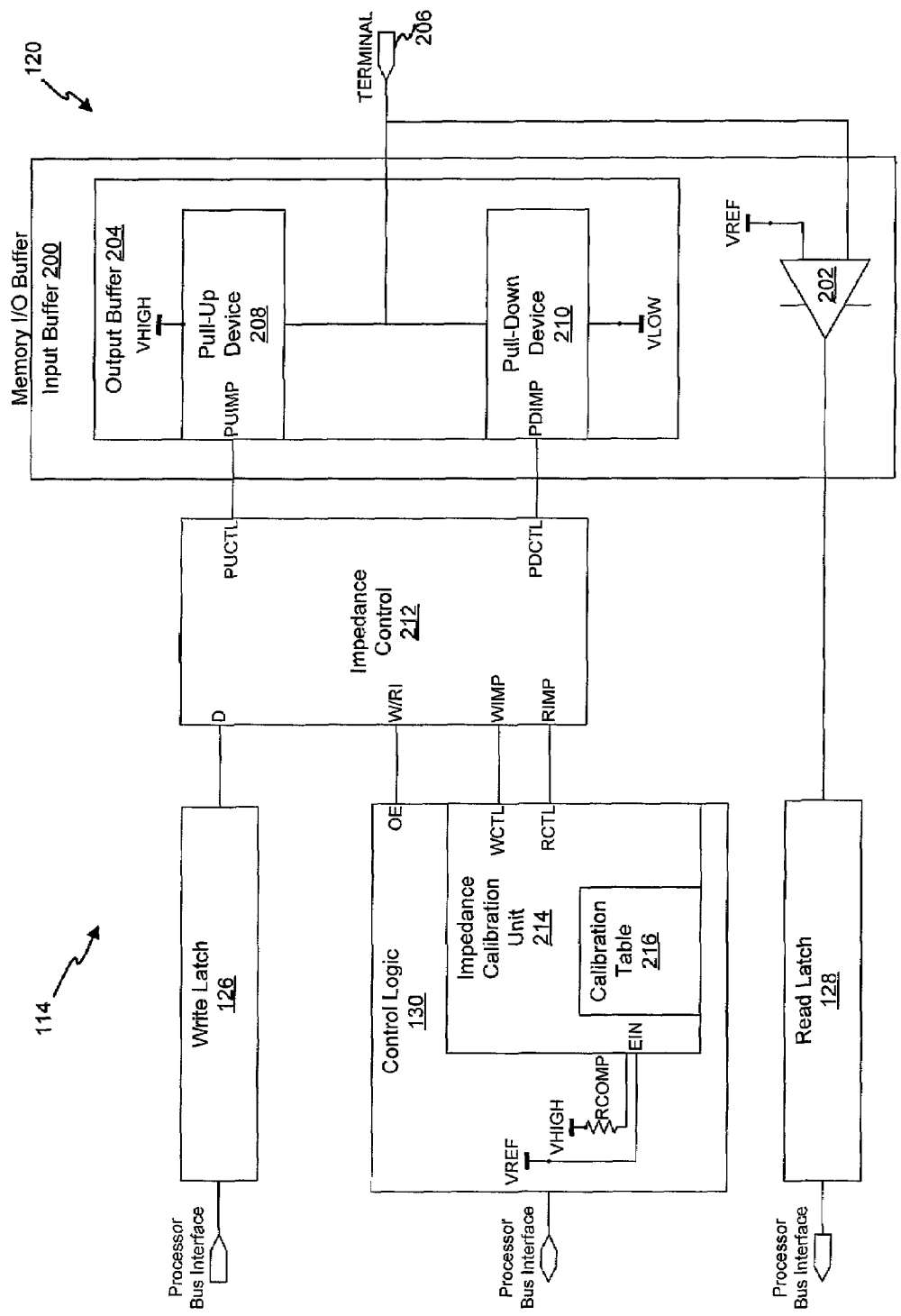
FIG. 2 illustrates an embodiment of a memory controller of the computing device of FIG. 1.

Referring now to FIG. 2, an embodiment of the memory controller 114 is shown. As depicted, the memory I/O buffer 120 of the memory controller 114 comprises an input buffer 200 that comprises a receiver 202 and an output buffer 204. The output buffer 204 and the receiver 202 are coupled to a memory bus line terminal 206 such as, for example, a memory bus line pad, contact, or pin to transfer data to and from system memory 108. The input buffer 200 in one embodiment uses the output buffer 204 to terminate the terminal 206 during a memory read and/or an idle state so that the receiver 202 may accurately receive a data signal from the terminal 206 and provide the read latch 128 with the received data.

In one embodiment, the output buffer 204 comprises a programmable pull-up impedance device 208 that is coupled between a high voltage source VHIGH (e.g. 1.5 volts) and the terminal 206. The output buffer 204 further comprises a programmable pull-down impedance device 210 that is coupled between the terminal 206 and a low voltage source (e.g. ground). The pull-up device 208 comprises an impedance control input PUIMP to receive a pull-up control signal and the pull-down device 210 comprises an impedance control input PDIMP to receive a pull-down control signal. In one embodiment, the impedance control inputs PUIMP, PDIMP each comprise multiple input lines to receive multi-bit control signals. In another embodiment, the impedance control inputs PUIMP, PDIMP each comprise a single input line to receive control signals having only two states. In yet another embodiment, the impedance control inputs PUIMP, PDIMP each comprise a single input line to receive encoded or serially transmitted control signals.

The pull-up device 208 is to disconnect the high voltage source VHIGH from the terminal 206 in response to being deactivated by the pull-up control signal. In one embodiment, the pull-up device 208 disconnects the high voltage source VHIGH from the terminal 206 by establishing a very high impedance between the high voltage source VHIGH and the terminal 206. Further, the pull-up device 208 is to pull the terminal 206 toward the high voltage source VHIGH in response to being activated by the pull-up control signal. In one embodiment, the pull-up device 208 pulls the terminal toward the high voltage source VHIGH by establishing a pull-up impedance between the high voltage source VHIGH and the terminal 206 that has a magnitude controlled by the pull-up control signal.

Similarly, the pull-down device 210 is to disconnect the low voltage source VLOW from the terminal 206 in response to being deactivated by the pull-down control signal. In one embodiment, the pull-down device 210 disconnects the low voltage source VLOW from the terminal 206 by establishing a very high impedance between the voltage source VLOW and the terminal 206. Further, the pull-down device 210 is to pull the terminal 206 toward the low voltage source VLOW in response to being activated by the pull-down control signal. In one embodiment, the pull-down device 210 pulls the terminal toward the low voltage source VLOW by establishing a pull-down impedance between the low voltage source VLOW and the terminal 206 that has a magnitude controlled by the pull-down control signal.

The memory controller 114 further comprises an impedance control 212 to control the impedance of the pull-up and pull-down devices 208, 210. In one embodiment, the impedance logic 212 comprises a data input D to receive a data signal that is indicative of data to be written to system memory 108 and a write input W/RI to receive a write signal or a read signal that indicates whether to configure the memory I/O buffer 120 for a memory write or a memory read. The impedance control 212 may further comprise a write impedance input WIMP to receive a write control signal that indicates the programmable impedance of the pull-up and pull-down devices 208, 210 during a memory write. The impedance control logic 212 may also comprise a read impedance input RIMP to receive a read control signal that indicates the programmable impedance of the pull-up and pull-down devices 208, 210 during a memory read or idle state.

The impedance control 212 may further comprise a pull-up control output PUCTL coupled to the impedance control input PUIMP of the pull-up device 208. In one embodiment, the impedance control 212 generates on the pull-up control output PUCTL a pull-up control signal that is dependent upon data signals, write signals, write control signals, and read control signals received by its data input D, write input W/RI, write impedance input WIMP, and read impedance input RIMP. The impedance control 212 may also comprise a pull-down control output PDCTL coupled to the impedance control input PDIMP of the pull-down device 210. In one embodiment, the impedance control 212 generates on the pull-down control output PDCTL a pull-down control signal that is dependent upon data signals, write signals, write control signals, and read control signals received by its data input D, write input W/RI, write impedance input WIMP, and read impedance input RIMP.

The control logic 130 of the memory controller 114 may comprise an impedance calibration unit 214 to provide read control signals and write control signals to the impedance control 212 via its read control output RCTL and its write control output WCTL. The impedance calibration unit 214 may comprise one or more environment inputs EIN to receive one or more environmental parameters from which the impedance calibration unit 214 may adjust the read control signals and the write control signals. The impedance calibration unit 214 may utilize various techniques to adjust the read control signals and write control signals based upon environmental signals of the environmental inputs EIN. For example, in one embodiment, the impedance calibration unit 214 may receive temperature signals, voltage signals, and/or silicon process signals from sensors, configuration registers, or other devices and may adjust the read and write control signals based upon the received signals.

In another embodiment, the impedance calibration unit 214 may receive signals as a result of a calibration resister RCOMP and a reference voltage VREF being coupled to the environmental inputs EIN. The impedance calibration unit 214 may obtain a pull-up calibration value and a pull-down calibration value by selectively switching on transistors of the impedance calibration unit 214 until a predetermined relationship to the calibration resister RCOMP and the reference voltage VREF is obtained. See, U.S. Pat. No. 6,347,850 "Programmable Buffer Circuit" filed Dec. 23, 1999 for an implementation of an impedance calibration unit 214 that obtains a pull-up calibration value and a pull-down calibration value based upon the effective resistance of a calibration resistor RCOMP and a reference voltage VSWING. However, it should be appreciated that other known calibration techniques may be used to compensate for process, voltage, and/or temperature variations.

The impedance calibration unit 214 may further comprise a calibration table 216 of control values from which the impedance calibration unit 214 may generate the write control signals and the read control signals. The impedance calibration unit 214 may index the calibration table 216 with index values derived from the parameter signals of the environment inputs EIN to receive control values that account for process, voltage, and/or temperature variations. In one embodiment, the calibration table 216 contains write pull-up values and read pull-up values that are indexed to pull-up calibration values derived from the calibration resistor RCOMP and the voltage reference VREF. Further, the calibration table 216 contains write pull-down values and read pull-down values that are indexed to pull-down calibration values derived from the calibration resistor RCOMP and the voltage reference VREF. It should be appreciated that the the control values may be indexed to other values that account for process, voltage, and/or temperature variations.

As depicted, the memory controller 114 comprises a single memory I/O buffer 120. However, in other embodiments, the memory controller 114 may comprise a separate memory I/O buffer 120 for each memory bus line 122 or group of memory bus lines 122. Further, the memory controller 114 may comprise a separate impedance control 212 and/or a separate impedance calibration unit 214 for each memory I/O buffer 120. Such embodiments enable separately programming the impedances of the memory I/O buffers 120.

Figure 3:
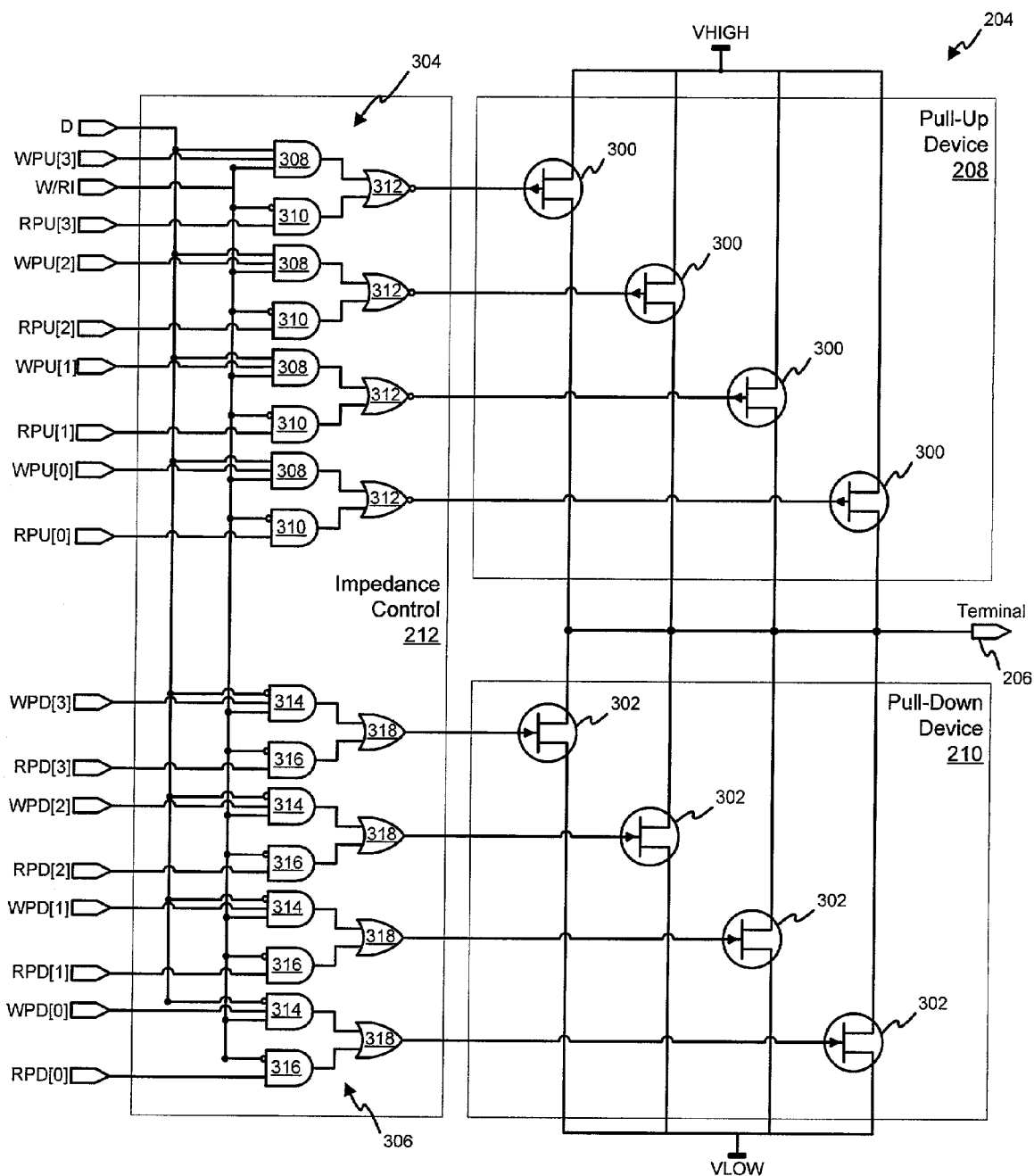
FIG. 3 illustrates an embodiment of a memory input/output buffer of the memory controller of FIG. 2.

In FIG. 3, an embodiment of the impedance control 212 and the output buffer 204 is shown. As illustrated, the output buffer 204 may comprise a set of p-channel MOSFETs 300 arranged in parallel between the high voltage source VHIGH and the terminal 206 and a set of n-channel MOSFETs 302 arranged in parallel between the low voltage source VLOW and the terminal 206. The number and values of the p-channel MOSFETs 300 that are turned on when the pull-up device 208 is activated determines the impedance established between high voltage source VHIGH and the terminal 206. Similarly, the number and values of the MOSFETs that are turned on when the pull-down device 210 is activated determines the impedance established between low voltage source VLOW and the terminal 206. In one embodiment, the MOSFETs 300, 302 are sized in a binary progression to allow a wide range of impedance programming (e.g. between 25 and 500 ohms) and with a sufficient number to obtain a sufficiently small granularity (e.g. about 1.5 ohms). As depicted, the pull-up device 208 of the output buffer 204 comprises four p-channel MOSFETS 300 and the pull-down device 210 comprises four n-channel MOSFETS 302. However, other embodiments the pull-up device 208 and the pull-down device 210 may comprise other numbers of switching devices (e.g. MOSFETS, JFETS, etc.). Further, in other embodiments, the pull-up device 208 may comprise fewer or more switching devices than the pull-down device 210.

As illustrated, the impedance control 212 comprises a pull-up multiplexer 304 and a pull-down multiplexer 306. The pull-up multiplexer 304 comprises AND gates 308, 310 and NOR gates 312 and the pull-down multiplexer 306 comprises AND gates 314, 316 and OR gates 318. However, it should be appreciated that other embodiments may implement the impedance control 212 differently. The pull-up multiplexer 304 generates a pull-up control signal that selectively turns on zero or more of the p-channel MOSFETs 300, and the pull-down multiplexer 306 generates a pull-down control signal that selectively turns on zero or more of the n-channel MOSFETs 302. In one embodiment, the pull-up multiplexer 304 generates the pull-up control signal based upon a data signal of the data input D, a write signal of the write input W/RI, a pull-up portion WPU [0:3] of the write control signal received on write impedance inputs WIMP, and a pull-up portion RPU[0:3] of the read control signal received on read impedance inputs RIMP. Similarly, the pull-down multiplexer 306 generates the pull-down control signal based upon the data signal of the data input D, the write signal of the write input W/RI, a pull-down portion WPD[0:3] of the write control signal received on write impedance input WIMP, and a pull-down portion RPD[0:3] of the read control signal received on read impedance inputs RIMP.

In one embodiment, the impedance control 212 and the memory I/O buffer 120 operate in a write mode in response to the value of the write input W/RI being HIGH. As can be seen, when the value of the data input D is LOW and the value of the write input W/RI is HIGH, the output of each AND gate 308, 310 is LOW thus causing the output of each NOR gate 312 to be HIGH. As a result of the output of the NOR gate 312 being HIGH, each p-channel MOSFET 300 is turned off and the pull-up device 208 is deactivated. Further, when the value of the data input D is LOW and the value of the write input is HIGH, the output of each AND gate 314 and therefore the output of each OR gate 318 is dependent upon the state of a corresponding bit of the write pull-down portion WPD[0:3]. In particular, if a bit of the write pull-down portion WPD[0:3] is HIGH, the corresponding output of the OR gate 318 is HIGH thus activating the pull-down device 210 by turning on the corresponding n-channel MOSFET 302. Conversely, if a bit of the write pull-down portion WPD[0:3] is LOW, the corresponding output of the OR gate 318 is LOW thus turning off the corresponding n-channel MOSFET 302.

Similarly, when the value of the data input D is HIGH and the value of the write input W/RI is HIGH, the output of each AND gate 314, 316 is LOW thus causing the output of each OR gate 318 to be LOW. As a result of the output of the OR gate 318 being LOW, each n-channel MOSFET 300 is turned off and the pull-down device 210 is deactivated. Further, when the value of the data input D is HIGH and the value of the write input is HIGH, the output of each AND gate 308 and therefore the output of each NOR gate 312 is dependent upon the state of a corresponding bit of the write pull-up portion WPU[0:3]. In particular, if a bit of the write pull-up portion WPU[0:3] is HIGH, the corresponding output of the NOR gate 318 is LOW thus activating the pull-up device 208 by turning on the corresponding P-channel MOSFET 300. Conversely, if a bit of the write pull-up portion WPU[0:3] is LOW, the corresponding output of the NOR gate 312 is HIGH thus turning off the corresponding p-channel MOSFET 300.

In one embodiment, the impedance control 212 and the memory I/O buffer 120 operate in a read mode and/or idle mode in response to the value of the write input W/RI being LOW. As can be seen, when the value of the write input W/RI is LOW irrespective of the value of the data input D, the output of each AND gate 310 and therefore the output of each NOR gate 312 is dependent upon the state of a corresponding bit of the read pull-up portion RPU[0:3]. In particular, if a bit of the read pull-up portion RPU[0:3] is HIGH, the corresponding output of the NOR gate 312 is LOW thus activating the pull-up device 208 by turning on the corresponding p-channel MOSFET 300. Conversely, if a bit of the read pull-up portion RPU[0:3] is LOW, the corresponding output of the NOR gate 312 is HIGH thus turning off the corresponding p-channel MOSFET 300.

Similarly, when the value of the write input W/RI is LOW irrespective of the value of the data input D, the output of each AND gate 316 and therefore the output of each OR gate 318 is dependent upon the state of a corresponding bit of the read pull-down portion RPD[0:3]. In particular, if a bit of the read pull-down portion RPD[0:3] is HIGH, the corresponding output of the OR gate 318 is HIGH thus activating the pull-down device 210 by turning on the corresponding n-channel MOSFET 302. Conversely, if a bit of the read pull-down portion RPD [0:3] is LOW, the corresponding output of the OR gate 318 is LOW thus turning off the corresponding n-channel MOSFET 302.

Figure 4:
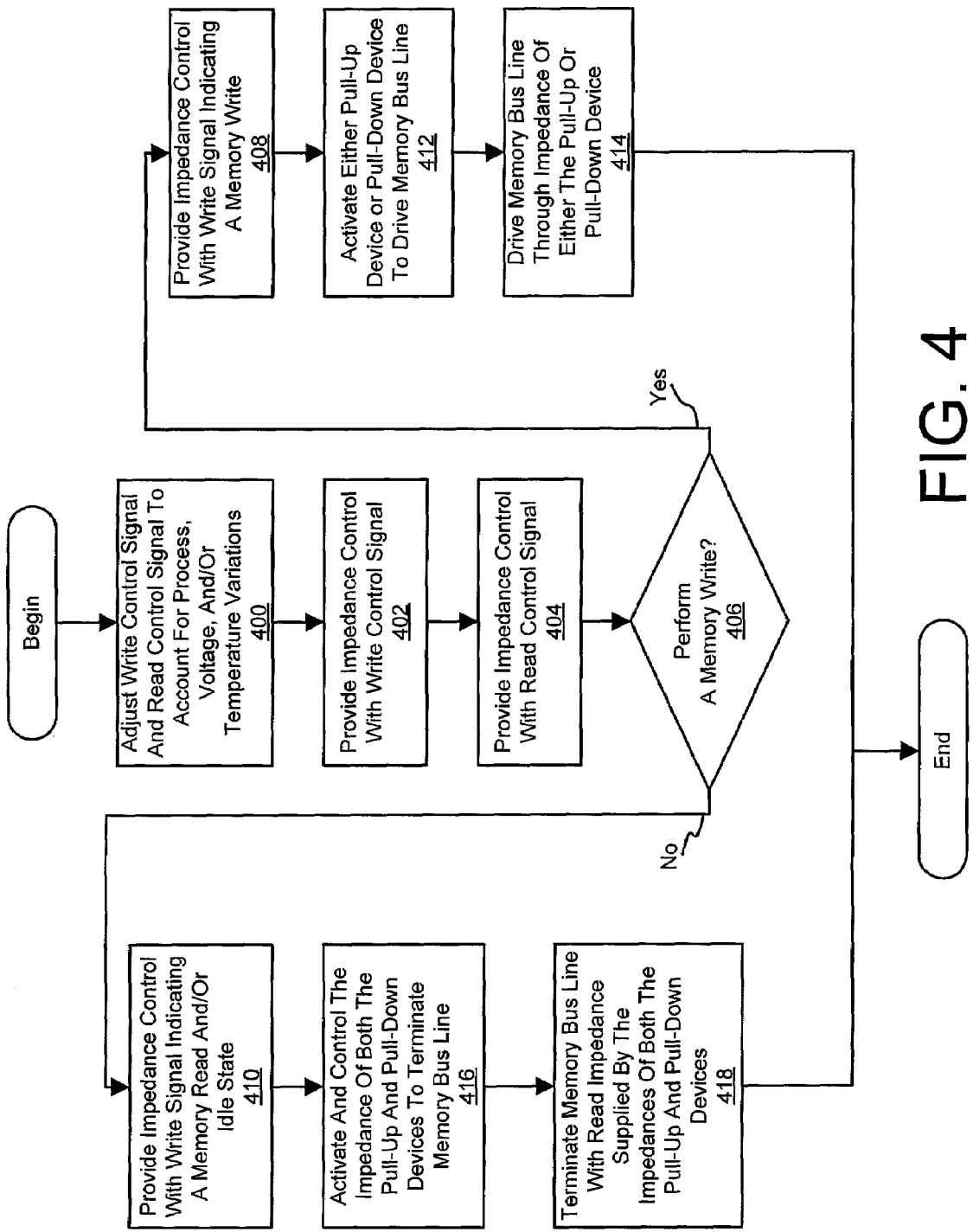
FIG. 4 illustrates operation of an embodiment of the memory controller depicted in FIGS. 2 and 3.

Referring now to FIG. 4, operation of an embodiment of the memory controller 114 is depicted. In block 400, the impedance calibration unit 214 adjusts a write control signal and a read control signal to account for process, voltage, and/or temperature variations. In one embodiment, the write control signal comprises a write pull-up portion WPU[0:3] and a write pull-down portion WPD[0:3] to respectively control the impedance of the pull-up device 208 and the pull-down device 210 during a memory write. Similarly, in one embodiment, the read control signal comprises a read pull-up portion RPU[0:3] and a read pull-down portion RPD[0:3] to respectively control the impedance of the pull-up device 208 and the pull-down device 210 during a memory read and/or an idle state.

In block 402, the control logic 130 provides the write impedance input WIMP of the impedance control 212 with the write control signal comprising the write pull-up portion WPU[0:3] and the write pull-down portion WPD[0:3]. Similarly, the control logic 130 in block 404 provides the read impedance input RIMP of the impedance control 212 with the read control signal comprising the read pull-up portion RPU[0:3] and the read pull-down portion RPD[0:3].

In block 406, the control logic 130 determines whether to perform a memory write based upon signals received from the processor bus interface 112 and the state of the memory bus 124. In response to determining to perform a memory write, the control logic 130 in block 408 provides the write input W/RI of the impedance control 212 with a HIGH write signal to indicate a memory write. Conversely, the control logic 130 in block 410 provides the write input W/RI of the impedance control 212 with a LOW write signal to indicate a memory read and/or an idle state in response to determining not to perform a memory write, The impedance control 212 in block 412 activates either the pull-up device 208 or the pull-down device 210 to drive a data signal on the memory bus line 122. In one embodiment, the impedance control 212 in response to its data input D being HIGH provides the impedance control input PUIMP of the output buffer 204 with a pull-up control signal that activates the pull-up device 208 with an impedance specified by the write pull-up portion WPU[0:3] of its write impedance input WIMP and provides the impedance control input PDIMP of the output buffer 204 with a pull-down control signal that deactivates the pull-down device 210. Similarly, in one embodiment, the impedance control 212 in response to its data input D being LOW provides the impedance control input PDIMP of the output buffer 204 with a pull-down control signal that activates the pull-down device 210 with an impedance specified by the write pull-down portion WPD[0:3] of its write impedance input WIMP and provides the impedance control input PUIMP of the output buffer 204 with a pull-up control signal that deactivates the pull-up device 208.

The output buffer 204 in block 414 drives a data signal upon the memory bus line 122 via the terminal 206. In one embodiment, the output buffer 204 pulls the memory bus line 122 toward the high voltage source VHIGH via the programmed impedance of the pull-up device 208 to drive a HIGH data signal on the memory bus line 122 in response to the pull-up device 208 being activated and the pull-down device 210 being deactivated. Similarly, the output buffer 204 pulls the memory bus line 122 toward the low voltage source VLOW via the programmed impedance of the pull-down device 210 to drive a LOW data signal on the memory bus line 122 in response to the pull-down device 210 being activated and the pull-up device 208 being deactivated.

In response to determining not to perform a memory write, the impedance control 212 in block 416 activates and controls the impedance of both the pull-up device 208 and the pull-down device 210 to terminate the memory bus line 122 during a memory read and/or idle state. In one embodiment, the impedance control 212 in response to its write input W/RI being LOW provides the impedance control input PUIMP of the output buffer 204 with a pull-up control signal that activates the pull-up device 208 with an impedance specified by the read pull-up portion RPU[0:3] of its read impedance input RIMP. Further, the impedance control 212 in response to its write input W/RI being LOW provides the impedance control input PDIMP of the output buffer 204 with a pull-down control signal that activates the pull-down device 210 with an impedance specified by the read pull-down portion RPD[0:3] of its read impedance input RIMP.

The output buffer 204 in block 418 terminates the memory bus line 122 based upon the received pull-up and pull-down control signals. In one embodiment, the output buffer 204 pulls the memory bus line 122 toward the high voltage source VHIGH via the programmed impedance of the pull-up device 208 and pulls the memory bus line 122 toward the low voltage source VLOW via the programmed impedance of the pull-down device 210. Accordingly, the programmed impedances of the pull-up and pull-down devices 208, 210 combine to terminate the memory bus line 122. For example, the pull-up device 208 may establish a 400 Ohm impedance between the high voltage source VHIGH and the terminal 206 and the pull-down device 210 may establish a 400 Ohm impedance between the low voltage source VLOW and the terminal 206 thereby establishing a 200 Ohm read termination impedance between the terminal 206 and the voltage sources VHIGH, VLOW.

While certain features of the invention have been described with reference to example embodiments, the description is not intended to be construed in a limiting sense. Various modifications of the example embodiments, as well as other embodiments of the invention, which are apparent to persons skilled in the art to which the invention pertains are deemed to lie within the spirit and scope of the invention.

What is claimed is:

1. A memory controller comprising
a memory line terminal to couple to a memory bus line,
an output buffer coupled to the memory bus line terminal
to drive the memory bus line in response to first control signals and to terminate the memory bus line in response to second control signals, and
circuitry to provide the output buffer with the first control signals in response to a memory write and to provide the output buffer with the second control signals in response to a memory read.

2. The memory controller of claim 1 further comprising a receiver coupled to the memory bus line terminal to receive data during the memory read.

3. The memory controller of claim 2 further comprising
a write latch coupled to the output buffer to provide the output buffer with data to drive on the memory bus line in response to the first control signals, and
a read latch coupled to the receiver to latch data received by the receiver during the memory read.

4. The memory controller of claim 1 wherein the circuitry is to further program the output buffer with a first impedance during the memory write and is to program the output buffer with a second impedance during the memory read such that the first impedance and second impedance are adjusted for process variations.

5. The memory controller of claim 1 wherein
the output buffer comprises a plurality of first transistors coupled between a first voltage source and the memory bus line terminal, and a plurality of second transistors coupled between a second voltage source and the memory bus line terminal, and
the circuitry is to generate the second control signals to selectively turn on one or more of the first transistors and one or more of the second transistors during the memory read.

6. The memory controller of claim 5 wherein
the circuitry is to generate the first control signals to selectively turn on either one or more of the first transistors or one or more of the second transistors during the memory write.

7. The memory controller of claim 5 wherein the circuitry further comprises a table to provide a first indication as to which transistors of the first transistors and the second transistors to turn on during the memory write, and to provide a second indication as to which transistors of the first transistors and the second transistors to turn on during the memory read.

8. The memory controller of claim 7 wherein the the table is to select the first control value and the second control value from a plurality of control values based upon an index value derived from one or more environmental parameters.

9. An computing device, comprising
a processor to generate read requests and write requests,
a volatile memory to store data, and
a memory controller coupled to the processor via a processor bus and coupled to the volatile memory via a memory bus, the memory controller comprising
an output buffer to write data to the volatile memory via the memory bus,
a receiver to receive data from the volatile memory via the memory bus, and
circuitry to cause the output buffer to write data to the volatile memory in response to a write request of the processor bus and to cause the output buffer to provide the memory bus with a termination impedance in response to a read request of the processor bus.

10. The computing device of claim 9, wherein the output buffer comprises
a first impedance device coupled between a memory bus line of the memory bus and a first voltage source, and
a second impedance device coupled between the memory bus line and a second voltage source, and
the circuitry is
to cause the first impedance device to pull the memory bus line toward the first voltage source to write first data,
to cause the second impedance device to pull the memory bus line toward the second voltage source to write second data, and
to cause both the first impedance device and the second impedance device to respectively pull the memory bus line toward the first voltage source and the second voltage source in response to the read request.

11. The computing device of claim 9, wherein the output buffer comprises
a first programmable impedance device having a first impedance magnitude that is controlled by a first control signal, the first programmable impedance device to pull the memory bus line toward a first voltage source, and a second programmable impedance device having a second impedance magnitude that is controlled by a second control signal, the second programmable impedance device to pull the memory bus line toward a second voltage source, and
the circuitry is to generate the first control signal to drive a first data signal on the memory bus, is to generate the second control signal to drive a second data signal on the memory bus, and is to generate the first control signal and the second control signal to terminate the memory bus during a memory read.

12. The computing device of claim 11, wherein
the memory comprises double data rate memory.

13. A memory controller comprising
an output buffer to drive a memory bus line in response to a memory write, and
to terminate the memory bus line after driving the memory bus line,
wherein the output buffer comprises a pull-up impedance device and a pull-down impedance device, and the output buffer selectively drives the memory bus line via the pull-up impedance device or the pull-up impedance device based upon data signal to transmit on the memory bus line.

14. The memory controller of claim 13 wherein the output buffer terminates the memory bus with the pull-up impedance device and the pull-down impedance device.

15. The memory controller of claim 14 wherein the output buffer terminates the memory bus during an idle state of the memory bus line.

16. The memory controller of claim 14 wherein the output buffer terminates the memory bus during a read state of the memory bus line.

17. The memory controller of claim 14 wherein
the pull-up impedance device comprises a plurality of switching devices,
the pull-down impedance device comprises a plurality of switching devices, and
the output buffer selectively turns on one or more switching devices of the pull-up impedance device or selectively turns on one or more switching devices of the pull-down impedance device to provide the memory bus line with an adjustable write impedance.

18. The memory controller of claim 14 wherein
the pull-up impedance device comprises a plurality of switching devices,
the pull-down impedance device comprises a plurality of switching devices, and
the output buffer selectively turns on one or more switching devices of the pull-up impedance device and selectively turns on one or more switching devices of the pull-down impedance device to provide the memory bus line with an adjustable read impedance.

19. A memory controller comprising
a pull-up impedance device,
a pull-down impedance device, and
a controller to selectively drive a memory bus line via the pull-up impedance device or the pull-down impedance device based upon data to write to a memory via the memory bus line, and to terminate the memory bus line with the pull-up impedance and the pull-down impedance in response to a read from the memory via the memory bus line.

20. The memory controller of claim 19 wherein
the pull-up impedance device comprises a plurality of switching devices, the pull-down impedance device comprises a plurality of switching devices, and the controller selectively turns on one or more switching devices of the pull-up impedance device or selectively turns on one or more switching devices of the pull-down impedance device to provide the memory bus line with an adjustable write impedance.

21. The memory controller of claim 19 wherein the pull-up impedance device comprises a plurality of switching devices, the pull-down impedance device comprises a plurality of switching devices, and the controller selectively turns on one or more switching devices of the pull-up impedance device and selectively turns on one or more switching devices of the pull-down impedance device to provide the memory bus line with an adjustable read impedance.

22. An computing device, comprising a processor to generate read requests and write requests, a volatile memory to store data, and a memory controller coupled to the processor via a processor bus and coupled to the volatile memory via a memory bus, the memory controller comprising a pull-up impedance device, a pull-down impedance device, and a controller to selectively drive a memory bus line via the pull-up impedance device or the pull-down impedance device based upon data to write to the memory via a memory bus line of the memory bus, and to terminate the memory bus line with the pull-up impedance and the pull-down impedance in response to a read from the memory via the memory bus line.

23. The computer system of claim 22 wherein the pull-up impedance device comprises a plurality of switching devices, the pull-down impedance device comprises a plurality of switching devices, and the controller selectively turns on one or more switching devices of the pull-up impedance device or selectively turns on one or more switching devices of the pull-down impedance device to provide the memory bus line with an adjustable write impedance.

24. The computer system of claim 22 wherein the pull-up impedance device comprises a plurality of switching devices, the pull-down impedance device comprises a plurality of switching devices, and the controller selectively turns on one or more switching devices of the pull-up impedance device and selectively turns on one or more switching devices of the pull-down impedance device to provide the memory bus line with an adjustable read impedance.

25. The computer system of claim 22 wherein the pull-up impedance device comprises a plurality of switching devices, the pull-down impedance device comprises a plurality of switching devices, and the controller selectively turns on one or more switching devices of the pull-up impedance device and selectively turns on one or more switching devices of the pull-down impedance device to provide the memory bus line with an adjustable idle impedance.

\* \* \* \* \*